United States Patent
Yamada et al.

(10) Patent No.: US 11,390,079 B2
(45) Date of Patent: Jul. 19, 2022

(54) MEMS DEVICE, LIQUID EJECTING HEAD, LIQUID EJECTING APPARATUS, MANUFACTURING METHOD OF MEMS DEVICE, MANUFACTURING METHOD OF LIQUID EJECTING HEAD, AND MANUFACTURING METHOD OF LIQUID EJECTING APPARATUS

(71) Applicant: SEIKO EPSON CORPORATION, Tokyo (JP)

(72) Inventors: Daisuke Yamada, Shiojiri (JP); Motoki Takabe, Shiojiri (JP); Yasuyuki Matsumoto, Azumino (JP); Yoichi Naganuma, Matsumoto (JP); Eiju Hirai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 16/472,783

(22) PCT Filed: Dec. 5, 2017

(86) PCT No.: PCT/JP2017/043687
§ 371 (c)(1),
(2) Date: Jun. 21, 2019

(87) PCT Pub. No.: WO2018/116820
PCT Pub. Date: Jun. 28, 2018

(65) Prior Publication Data
US 2021/0129535 A1 May 6, 2021

(30) Foreign Application Priority Data
Dec. 21, 2016 (JP) .............................. JP2016-247531

(51) Int. Cl.
*B41J 2/14* (2006.01)
*B41J 2/16* (2006.01)
(Continued)

(52) U.S. Cl.
CPC ........... *B41J 2/14233* (2013.01); *B41J 2/161* (2013.01); *B41J 2/164* (2013.01); *B41J 2/1623* (2013.01);
(Continued)

(58) Field of Classification Search
CPC ...... B41J 2/14233; B41J 2/161; B41J 2/1623; B41J 2/1626; B41J 2/1635; B41J 2/164;
(Continued)

(56) References Cited

U.S. PATENT DOCUMENTS

2013/0276277 A1* 10/2013 Matsumoto ............ B41J 2/1645
  29/25.35
2017/0066240 A1* 3/2017 Hirai ........................ B41J 2/1629
2017/0066241 A1 3/2017 Naganuma et al.

FOREIGN PATENT DOCUMENTS

JP 2003-094648 4/2003
JP 2009-107162 5/2009
(Continued)

OTHER PUBLICATIONS

Machine translation of JP2010188547 (Year: 2010).*

*Primary Examiner* — Yasser A Abdelaziez
(74) *Attorney, Agent, or Firm* — Workman Nydegger

(57) ABSTRACT

Provided are an MEMS device, a liquid ejecting head, a liquid ejecting apparatus, a manufacturing method of a MEMS device, a manufacturing method of a liquid ejecting head and a manufacturing method of a liquid ejecting apparatus. Provided is a MEMS device that includes a first substrate on which a flexibly deformable thin film member is laminated, a second substrate disposed at an interval with respect to the first substrate, and an adhesion layer that adheres the first substrate to the second substrate, in which
(Continued)

an end of the thin film member extends to the outside of the end of the first substrate in an in-plane direction of the first substrate.

8 Claims, 5 Drawing Sheets

(51) Int. Cl.
    *B81B 3/00*         (2006.01)
    *B81B 7/00*         (2006.01)
    *B81C 3/00*         (2006.01)

(52) U.S. Cl.
    CPC ............ *B41J 2/1626* (2013.01); *B41J 2/1635* (2013.01); *B81B 3/0021* (2013.01); *B81B 7/0058* (2013.01); *B81C 3/001* (2013.01); *B41J 2002/14241* (2013.01); *B81B 2201/052* (2013.01); *B81C 2203/032* (2013.01)

(58) Field of Classification Search
    CPC ............ B41J 2002/14241; B41J 2/1632; B41J 2/1628; B41J 2/1634; B41J 2/1631; B41J 2/1645; B41J 2/1629; B41J 2202/18; B41J 2002/14491; B81B 3/0021; B81B 7/0058; B81B 2201/052; B81C 3/001; B81C 2203/032; B81C 1/00873
    See application file for complete search history.

(56) References Cited

FOREIGN PATENT DOCUMENTS

| | | | |
|---|---|---|---|
| JP | 2010-188547 | | 9/2010 |
| JP | 2010188547 | * | 9/2010 |
| JP | 2013-223997 | | 10/2013 |
| JP | 2017-052133 | | 3/2017 |
| JP | 2017-052135 | | 3/2017 |

* cited by examiner

MEMS DEVICE, LIQUID EJECTING HEAD, LIQUID EJECTING APPARATUS, MANUFACTURING METHOD OF MEMS DEVICE, MANUFACTURING METHOD OF LIQUID EJECTING HEAD, AND MANUFACTURING METHOD OF LIQUID EJECTING APPARATUS

CROSS REFERENCE TO RELATED APPLICATIONS

This application is a U.S. Nationalization of PCT Application Number PCT/JP2017-247531, filed Dec. 5, 2017, which claims priority of JP Patent Application No. 2016-247531, filed on Dec. 21, 2016, the entireties of which are incorporated herein by reference.

TECHNICAL FIELD

The present invention relates to an MEMS device having two substrates joined through an adhesion layer, a liquid ejecting head, a liquid ejecting apparatus, a manufacturing method of an MEMS device, a manufacturing method of a liquid ejecting head, and a manufacturing method of a liquid ejecting apparatus.

BACKGROUND ART

As a micro electro mechanical system (MEMS) device applied to a liquid ejecting head or the like, there is an MEMS device in which two substrates are joined with an adhesive in a state of being at an interval. For example, PTL 1 discloses a liquid ejecting head in which a flow path formation substrate is joined to a protection substrate with an adhesive. On a surface of the flow path formation substrate on the protection substrate side, a flexibly deformable diaphragm and a piezoelectric element that generates a pressure fluctuation in a pressure chamber are laminated. The piezoelectric element is disposed in a space formed between the flow path formation substrate and the protection substrate. As a manufacturing method of such a liquid ejecting head, a method of joining one substrate serving as a flow path formation substrate to another substrate serving as a protection substrate, removing a region to serve as a cutting line on the one substrate by etching, and thereafter cutting along the cutting line to divide into individual flow path formation substrate and protection substrate (for example, refer to PTL 1) is known.

CITATION LIST

Patent Literature

PTL 1: Japanese Unexamined Patent Application Publication No. 2013-223997

SUMMARY OF INVENTION

Technical Problem

By the way, in the PTL 1, since the adhesive for joining the two substrates is disposed on the cutting line, there is concern that cutting cannot be performed on the cutting line due to a manufacturing variation or that burrs are generated on the cutting surface. When cutting force (for example, a tensile force is an expanded break) is strengthened in order to secure reliable cutting, there is a concern that a part of the adhesive or the like is easily chipped away and that a foreign substance is generated. Then, in the liquid ejecting head in the related art as disclosed in the PTL 1, an end of the adhesive is aligned with an end of the flow path formation substrate or an end of the protection substrate, and it is difficult to expand an adhesion area without enlarging the flow path formation substrate and the protection substrate. That is, it is difficult to increase the adhesion strength between the substrates. These factors make it difficult to enhance the reliability of the liquid ejecting head.

The present invention is made in consideration of such circumstances, and an object thereof is to provide an MEMS device, a liquid ejecting head, a liquid ejecting apparatus, a manufacturing method of an MEMS device, a manufacturing method of a liquid ejecting head and a manufacturing method of a liquid ejecting apparatus that can enhance reliability.

Solution to Problem

An MEMS device according to the present invention is proposed to achieve the object described above and includes a first substrate on which flexibly deformable thin film member is laminated,
a second substrate disposed at an interval with respect to the first substrate, and
an adhesion layer that adheres the first substrate to the second substrate, in which
an end of the thin film member extends to an outside of the end of the first substrate in the in-plane direction of the first substrate.

According to the present invention, since the adhesion layer and the first substrate are removed from the end of the MEMS device, in manufacturing an MEMS device by cutting the first substrate and the second substrate, generation of burrs on an end surface of the adhesion layer and the first substrate and generation of a foreign substance due to chipping of a part thereof can be suppressed. As a result, the reliability of the MEMS device can be enhanced.

In the configuration described above, it is preferable that a protection layer be laminated at least on a portion of the thin film member outside the end of the first substrate.

According to this configuration, even when the first substrate is exposed to an etching solution in a state before the first substrate and the second substrate are cut, seepage of the etching solution between the first substrate and the second substrate can be suppressed. As a result, damage to the adhesion layer from the etching solution can be suppressed and a decrease of the adhesion strength can be suppressed. Therefore, the reliability of the MEMS device can be further enhanced.

In the configuration described above, the protection layer and the second substrate are provided apart from each other, and
it is preferable that a space be formed between the protection layer and the second substrate.

According to this configuration, in manufacturing an MEMS device by cutting the first substrate and the second substrate, cutting is facilitated.

It is preferable that the protection layer be made of a resin in any one of the configurations described above.

According to this configuration, generation of a foreign substance due to chipping of a part of the thin film member can be suppressed. As a result, the reliability of MEMS device can be further enhanced.

Further, it is preferable that a part of the protection layer overlap with the adhesion layer in any one of the configurations described above.

According to this configuration, since the adhesion layer is adhered to the first substrate or the thin film member through the protection layer, joining strength of the first substrate and the second substrate can be secured even when the adhesion force between the first substrate or the thin film member and the adhesion layer is not sufficiently obtained. Since the protection layer is laminated on the thin film member outside the end of the first substrate, compared with a case where the protection layer is not formed outside the first substrate, the adhesion area (adhesion area to the protection layer) on the first substrate side can be expanded. As a result, the adhesion strength of the protection layer and the thin film member can be increased, and consequently, the joining strength of the first substrate and the second substrate can be increased.

It is preferable that the protection layer and the adhesion layer are made of the same type of resin in any one of the configurations described above.

According to this configuration, adhesion property between the adhesion layer and the protection layer can be enhanced. As a result, the joining strength of the first substrate and the second substrate can be further increased.

Further, according to the present invention, the liquid ejecting head has a structure of any one of the MEMS devices in each configuration described above.

According to this configuration, the reliability of the liquid ejecting head can be enhanced.

According to the present invention, the liquid ejecting apparatus includes a liquid ejecting head in the configuration described above.

According to this configuration, the reliability of the liquid ejecting apparatus can be enhanced.

Then, according to the present invention, a manufacturing method of an MEMS device is a manufacturing method of the MEMS device including a first substrate on which a flexibly deformable thin film member is laminated, a second substrate disposed at an interval with respect to the first substrate, and an adhesion layer that adheres the first substrate to the second substrate.

The manufacturing method includes a protection layer formation step of forming a protection layer in a cutting region set between adjacent first substrates, the cutting region being a surface, on which the thin film member is laminated, of the first mother substrate to be a plurality of the first substrates;

a substrate joining step of forming the adhesion layer on either a surface, on which the protection layer is laminated, of the first mother substrate or a surface, which faces the protection layer, of a second mother substrate to be a plurality of the second substrate and joining the first mother substrate to the second mother substrate with the adhesion layer interposed therebetween;

an etching step of removing, by etching, the first mother substrate in the cutting region from a surface on an opposite side to a surface to which the second mother substrate is joined, leaving the thin film member and the protection layer; and a division step of dividing the joined first mother substrate and second mother substrate into the first substrate and the second substrate individually by cutting in the cutting region.

According to an aspect of the present invention, since the first mother substrate in the cutting region is removed, the first mother substrate and the second mother substrate are more easily cut. In this way, cutting failure of the first mother substrate and the second mother substrate can be suppressed. Since the protection layer is formed in the cutting region, generation of a foreign substance due to chipping of a part of the thin film member at the time of cutting can be suppressed. Further, generation of a crack in the thin film member in a state before the first mother substrate and the second mother substrate are cut can be suppressed. Then, even if a crack or the like is generated in the thin film member, since the protection layer is present, seepage of the etching solution between the first mother substrate and the second mother substrate in an etching step can be suppressed. As a result, damage to the adhesion layer from the etching solution can be suppressed, and the decrease of the adhesion strength can be suppressed. Therefore, an MEMS device of high reliability can be manufactured.

It is preferable that the adhesion layer be made of a photosensitive resin in a substrate joining step in the method described above.

According to this method, pattern formation of the adhesion layer is facilitated.

Further, it is preferable that a part of the adhesion layer in the cutting region be removed in the substrate joining step in the method described above.

According to this method, the cutting of the first mother substrate and the second mother substrate is facilitated.

According to the present invention, a manufacturing method of a liquid ejecting head uses the manufacturing method of an MEMS device of any one of each method described above.

According to this method, a liquid ejecting head of high reliability can be manufactured.

Further, according to the present invention, a manufacturing method of a liquid ejecting apparatus that includes a liquid ejecting head, and uses the manufacturing method of a liquid ejecting head described above.

According to this method, a liquid ejecting apparatus of high reliability can be manufactured.

DESCRIPTION OF EMBODIMENTS

Figure 1:
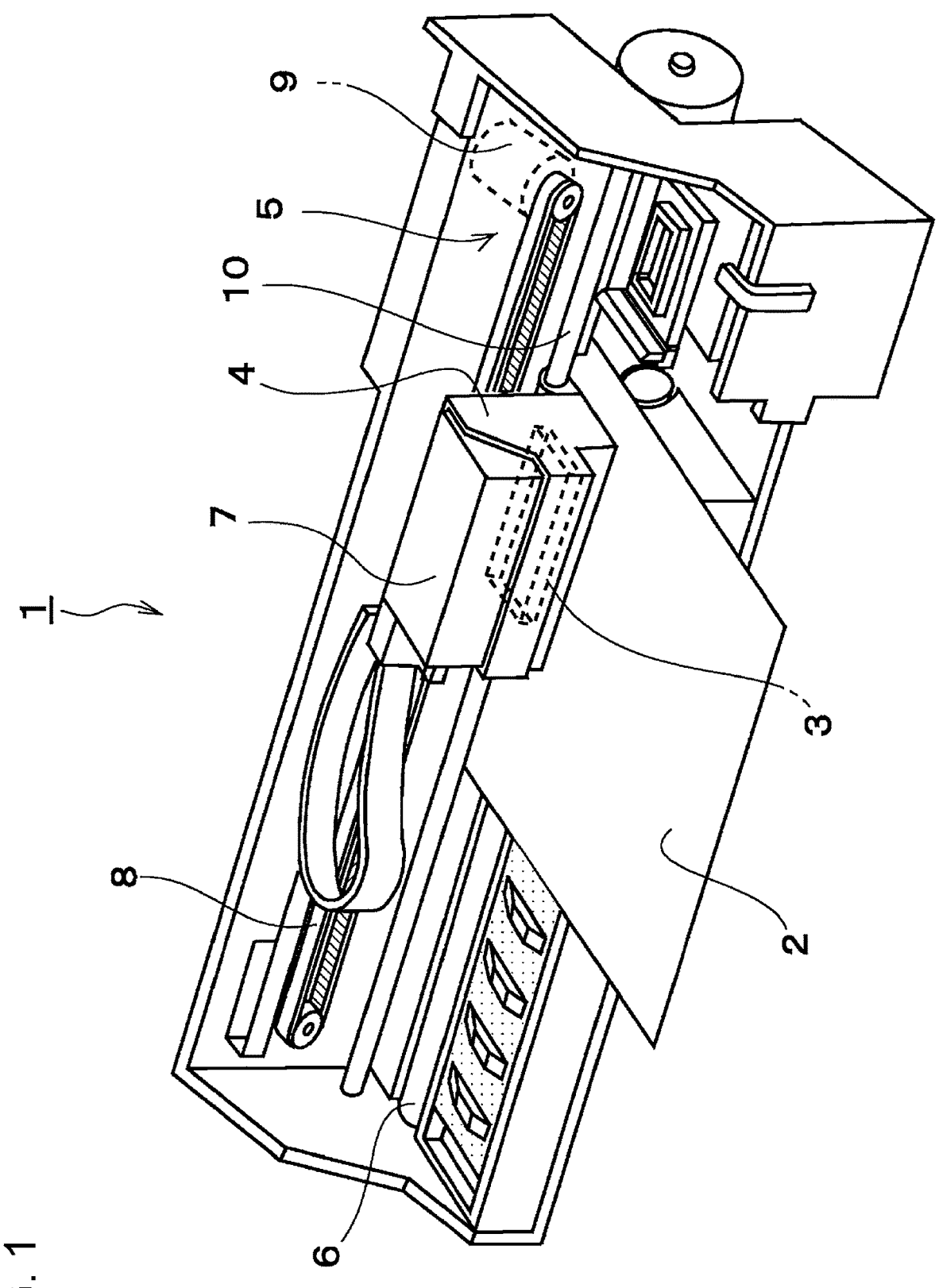
FIG. 1 is perspective view describing a configuration of a printer.

Hereinafter, an embodiment of the present invention will be described with reference to the attached drawings. In the embodiments described below, various restrictions are made as preferred specific examples according to the present invention, but unless otherwise stated to limit the present invention in particular, the scope of the present invention is not limited to these embodiments. In the following, a liquid ejecting head which is in a category of an MEMS device, an ink jet type recording head (hereinafter referred to as recording head) 3 which is a kind of liquid ejecting head in particular, will be described as an example. FIG. 1 is a perspective view of an ink jet type printer (hereinafter printer) 1 which is a kind of a liquid ejecting apparatus mounted with the recording head 3.

A printer 1 is an apparatus that performs recording of an image or the like by ejecting ink (a kind of liquid) onto a surface of a recording medium 2 (a kind of landing target) such as a recording paper sheet. The printer 1 includes the recording head 3, a carriage 4 to which the recording head 3 is attached, a carriage moving mechanism 5 that moves the carriage 4 along a main scanning axis, a transport mechanism 6 that transports the recording medium 2 along a sub-scanning axis, and the like. Here, the ink described above is stored in an ink cartridge 7 serving as a liquid supply source. The ink cartridge 7 is attachably/detachably mounted to the recording head 3. A configuration can be adopted such that the ink cartridge is disposed on the main body side of the printer and that the ink is supplied to the recording head from the ink cartridge through an ink supply tube.

The carriage moving mechanism 5 described above includes a timing belt 8. The timing belt 8 is driven by a pulse motor 9 such as a DC motor or the like. Therefore, when the pulse motor 9 operates, the carriage 4 is guided by a guide rod 10 installed on the printer 1 and reciprocates along the main scanning axis (width direction of the recording medium 2). The position of the carriage 4 along the main scanning axis is detected by a linear encoder (not shown) which is a kind of position information detection means. The linear encoder transmits a detection signal, that is, an encoder pulse (a kind of position information) to a controller of the printer 1.

Figure 2:
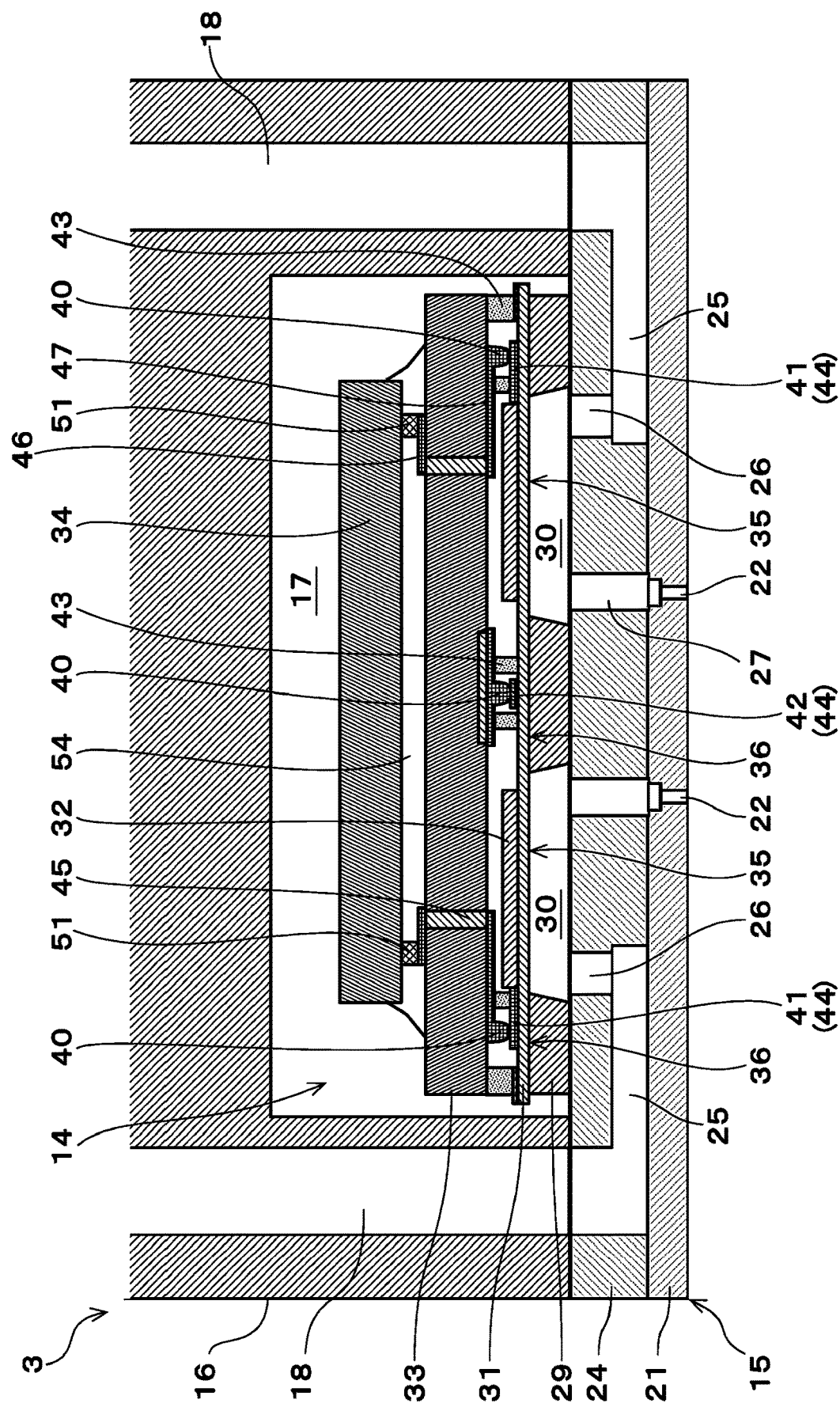
FIG. 2 is a sectional view describing a configuration of a recording head.
Figure 3:
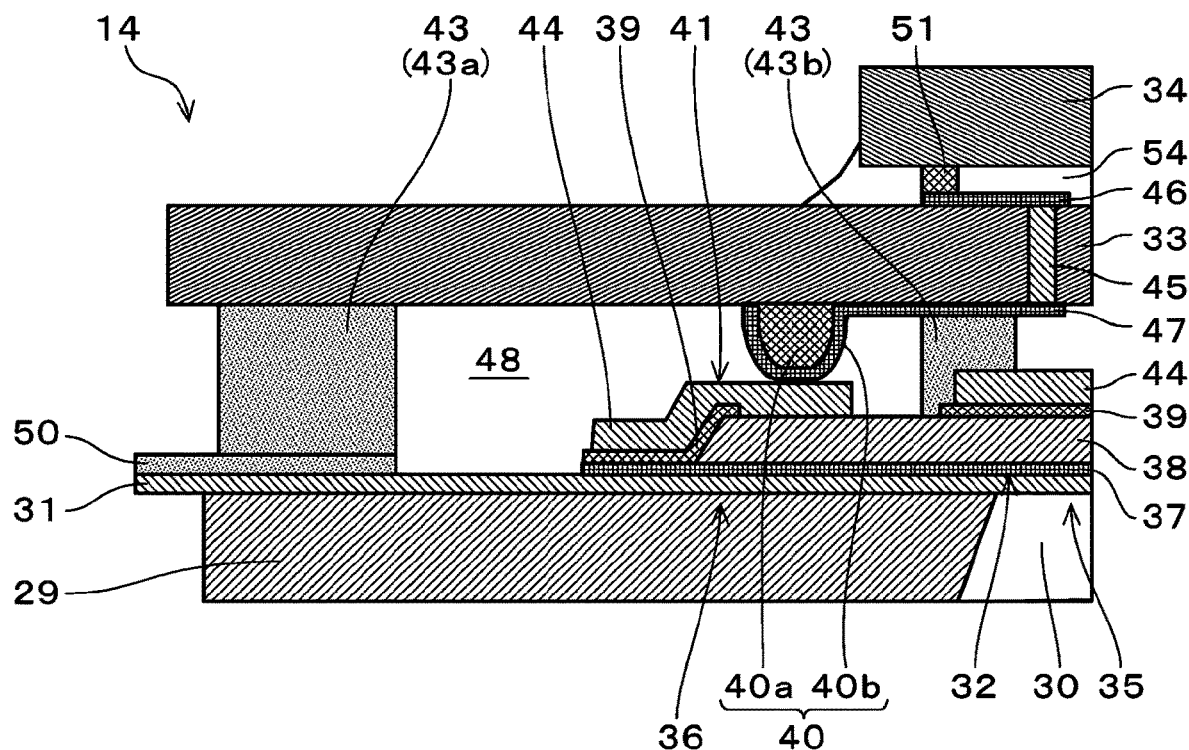
FIG. 3 is an enlarged sectional view of a main part of an actuator unit.
Figure 4:
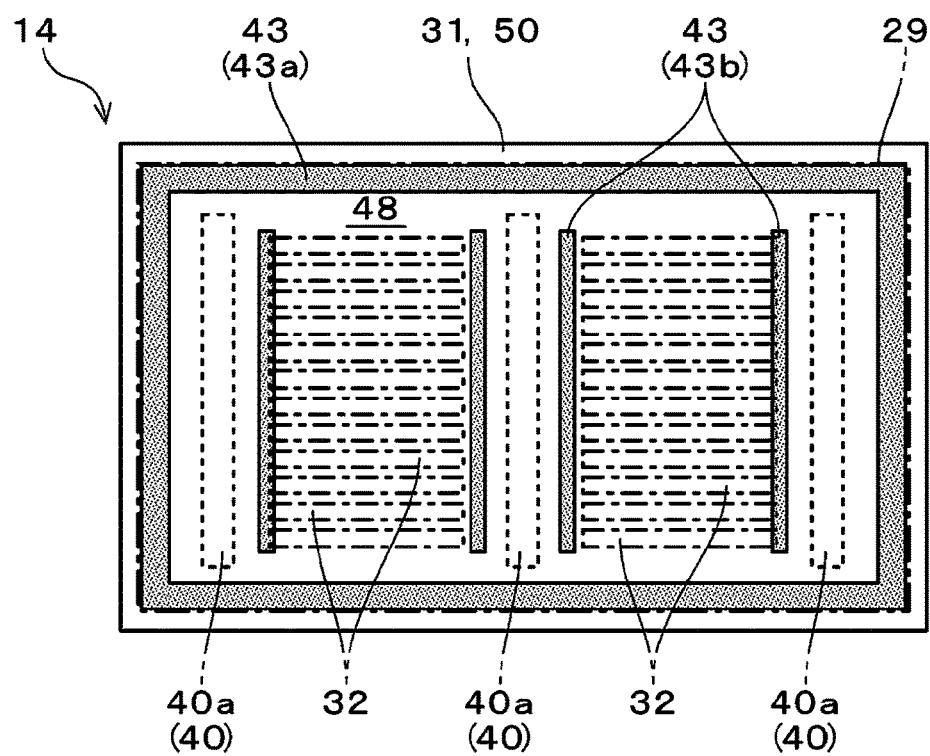
FIG. 4 is a plan view schematically showing the actuator unit.

Next, the recording head 3 will be described. FIG. 2 is a sectional view describing the configuration of the recording head 3. FIG. 3 is an enlarged sectional view of a one side end portion (left side end portion in FIG. 2) of an actuator unit 14. FIG. 4 is a plan view schematically showing the actuator unit 14. For the sake of convenience, a lamination direction of each member composing the actuator unit 14 will be referred to as a downward direction for the description. For the sake of description, the configurations other than adhesion layers 43, piezoelectric elements 32, and resin portions 40*a* of bump electrodes 40 are omitted in FIG. 4. In the present embodiment, as shown in FIG. 2, the recording head 3 is attached to a head case 16 in a state where the actuator unit 14 and the flow path unit 15 are laminated.

The head case 16 is a box-shaped member made of a synthetic resin and a liquid introduction path 18 through which ink is supplied to each pressure chamber 30 is formed inside the head case 16. Together with a common liquid chamber 25 to be described below, the liquid introduction path 18 is a space in which the ink shared in a plurality of pressure chambers 30 is stored. In the present embodiment, two liquid introduction paths 18 are formed in accordance with the rows of the pressure chambers 30 disposed side by side in two rows. On a lower surface side of the head case 16, a parallelepiped-shaped recessed accommodation space 17 is formed from the lower side to the middle in the height direction of the head case 16. When the flow path unit 15, to be described below, is joined in a state of being positioned under the lower surface of the head case 16, the actuator unit 14 (a pressure chamber formation substrate 29, a sealing plate 33, and a drive IC 34) laminated on a communication substrate 24 is configured to be accommodated inside the accommodation space 17. Further, in the head case 16 is formed a through hole through which a wiring substrate such as a flexible printed substrate (FPC) or the like that transmits a driving signal from the controller to the drive IC 34 is inserted (not shown). The accommodation space 17 communicates with the atmosphere through the through hole.

The flow path unit 15 joined to the lower surface of the head case 16 has the communication substrate 24 and a nozzle plate 21. The communication substrate 24 is a silicon substrate (for example, a silicon single crystal substrate) that constitutes an upper portion of the flow path unit 15. On the communication substrate 24, as shown in FIG. 2, an individual communication path 26 that communicates with the liquid introduction path 18 and individually supplies ink from each pressure chamber 30 to each pressure chamber 30 and a nozzle communication path 27 that causes the pressure chamber 30 and a nozzle 22 to communicate with each other are formed by anisotropic etching or the like. The common liquid chamber 25 is a hollow portion elongated in the nozzle row direction and two rows are formed corresponding to the rows of the pressure chamber 30 disposed side by side in two rows.

The nozzle plate 21 is a silicon substrate (for example, silicon single crystal substrate) joined to the lower surface (surface on the opposite side to the pressure chamber formation substrate 29) of the communication substrate 24. In the present embodiment, an opening on a lower surface side of a space to be the common liquid chamber 25 is sealed by the nozzle plate 21. A plurality of nozzles 22 are installed in a straight line (in rows) in the nozzle plate 21. Two nozzle rows are formed corresponding to the rows of the pressure chamber 30 formed in two rows. The plurality of nozzles 22 (nozzle rows) disposed side by side are provided at equal intervals in the sub-scanning direction orthogonal to the main scanning direction at a pitch corresponding to the dot formation density from the nozzle 22 on one end side to the nozzle 22 on the other end side. It should be noted that the nozzle plate may be joined to the region inward off from the common liquid chamber in the communication substrate and the opening on the lower surface side of the space to be the common liquid chamber can also be sealed with a member such as a flexible compliance sheet or the like. In this way, the nozzle plate can be made as small as possible.

As shown in FIGS. 2 and 3, the actuator unit 14 of the present embodiment is formed into a unit by the lamination of the pressure chamber formation substrate 29, a diaphragm 31, the piezoelectric element 32, the sealing plate 33, and a drive IC 34. The actuator unit 14 is formed to be smaller than the accommodation space 17 so as to be accommodated in the accommodation space 17.

The pressure chamber formation substrate 29 (corresponding to a first substrate in the present invention) is a hard plate material made of silicon and, in this embodiment, is made of a silicon single crystal substrate having the crystal surface orientation of the surface (upper surface and lower surface) as (110) surface. A part of the pressure chamber formation substrate 29 is completely removed in the plate thickness direction by anisotropic etching or the like and a plurality of spaces to be the pressure chambers 30 are disposed side by side in the nozzle row direction. The spaces, the lower side being partitioned by the communication substrate 24 and the upper side being partitioned by the diaphragm 31, constitute the pressure chambers 30. The spaces, that is, that pressure chambers 30 are formed in two rows corresponding to the nozzle rows formed in two rows. Each pressure chamber 30 is an elongated space in a direction orthogonal to the nozzle row direction and communicates with the individual communication path 26 at one side end portion in the lengthwise direction while communicating with the nozzle communication path 27 at the other side end portion. It should be noted that, in the present embodiment, as shown in FIG. 3, the outer shape of the pressure chamber formation substrate 29 is formed to be slightly smaller than the outer shape of the sealing plate 33 in a plan view.

The diaphragm 31 (corresponding to thin film member in the present invention) is a flexibly deformable thin film member, that is, a member having elasticity, and is laminated on the upper surface (surface on the opposite side to the communication substrate 24) of the pressure chamber formation substrate 29. In the present embodiment, as shown in FIG. 3, the outer shape of the diaphragm 31 is formed to be larger than the outer shape of the pressure chamber formation substrate 29. In other words, in the in-plane direction of the pressure chamber formation substrate 29, the end of the diaphragm 31 is positioned off from the adhesion layer 43 (outer peripheral adhesive 43a), to be described below, and extends to the outside of the end of the pressure chamber formation substrate 29. In the present embodiment, as shown in FIG. 4, the diaphragm 31 extends to the outside of the pressure chamber formation substrate 29 on the four sides of the actuator unit 14. Then, the pressure chamber 30 is partitioned by the diaphragm 31 formed as such. That is, as shown in FIGS. 2 and 3, the upper portion opening of the space to be the pressure chamber 30 is sealed by the diaphragm 31. The part of the diaphragm 31 that faces the pressure chamber 30 (specifically, upper portion opening of the pressure chamber 30) functions as a displacement unit displaced in a direction away from, or in a direction approaching, the nozzle 22 in accordance with the flexible deformation of the piezoelectric element 32. That is, the region facing the upper portion opening of the pressure chamber 30 in the diaphragm 31 becomes a driving region 35 in which a flexible deformation is allowed. On the other hand, the region off from the upper portion opening of the pressure chamber 30 in the diaphragm 31 becomes a non-driving region 36 in which a flexible deformation is hindered.

The diaphragm 31 is made of an elastic film made of a silicon dioxide ($SiO_2$) formed on an upper surface of the pressure chamber formation substrate 29 and an insulator film made of zirconium oxide ($ZrO_2$) formed on the elastic film. Then, the protection layer 50 is laminated on the outer peripheral portion of the insulation film (surface of the diaphragm 31 on the opposite side to the pressure chamber formation substrate 29). As shown in FIG. 3, the protection layer 50 in the present embodiment extends from a region overlapping with the adhesion layer 43 (outer peripheral adhesive 43a) to the end of the diaphragm 31 outside the end of the pressure chamber formation substrate 29. In the present embodiment, the protection layer 50 is provided apart from the sealing plate 33, that is, at an interval. Further, in the present embodiment, the protection layer 50 is made of the same type of resin as the adhesion layer 43 and bolsters the diaphragm 31 in the region where the protection layer 50 overlaps therewith. In particular, in the present embodiment, the portion of the diaphragm 31 protruding outward from the end of the pressure chamber formation substrate 29 is bolstered. Here, from the viewpoint of bolstering the diaphragm 31, it is preferable that the material constituting the protection layer 50 have larger rupture stress than the diaphragm 31. Further, it is preferable to have a larger rupture point elongation than the diaphragm 31.

Further, it is preferable to have larger Young's modulus than the diaphragm 31. For example, in the present embodiment, a resin having rupture stress of about 60 MPa, an elongation at rupture of about 4%, and the Young's modulus of about 2 GPa is used in the protection layer 50. On the other hand, from the viewpoint of ease of cutting, it is preferable that the thickness of the protection layer 50 be less than the thickness of the sealing plate 33, the thickness of the pressure chamber formation substrate 29, and the thickness of the adhesion layer 43 (that is, interval between the sealing plate 33 and the pressure chamber formation substrate 29). For example, in the present embodiment, the protection layer 50 is formed to have a thickness of 1 μm to 2 μm.

A piezoelectric element 32, which is a type of driving element, is laminated in a region, that is, in the driving region 35, corresponding to each pressure chamber 30 on the insulation film of the diaphragm 31. Corresponding to the pressure chamber 30 disposed side by side in two rows in the nozzle row direction, the piezoelectric element 32 is formed in two rows in the nozzle row direction. The piezoelectric element 32 of the present embodiment is a piezoelectric element of so-called deflection mode. As shown in FIG. 3, in the piezoelectric element 32, for example, a lower electrode layer 37, a piezoelectric layer 38, and an upper electrode layer 39 are laminated sequentially on the diaphragm 31. When the electric field corresponding to the potential difference between both the electrodes is applied between the lower electrode layer 37 and the upper electrode layer 39, the piezoelectric element 32 in such a configuration bends and deforms in a direction away from, or in a direction approaching, the nozzle 22. In the present embodiment, the lower electrode layer 37 is an individual electrode independently formed for each piezoelectric element 32, and the upper electrode layer 39 is a common electrode formed continuously over a plurality of the piezoelectric elements 32. That is, the lower electrode layer 37 and the piezoelectric layer 38 are formed for each pressure chamber 30. On the other hand, the upper electrode layer 39 is formed over a plurality of the pressure chambers 30. It should be noted that the lower electrode layer (that is, the lower electrode layer) can be used as a common electrode and the upper electrode layer (that is, the upper electrode layer) can be used as individual electrodes for the convenience of the driving circuit and wiring.

As shown in FIG. 3, one side (outer side of the pressure chamber formation substrate 29) of the lower electrode layer 37 extends to the outside of the piezoelectric layer 38 in a direction orthogonal to the nozzle row direction. That is, the end portion on one side of the lower electrode layer 37 is exposed from the piezoelectric layer 38, and an individual terminal 41 is laminated on this exposed portion. In the present embodiment, the individual terminal 41 is composed of the upper electrode layer 39 formed apart from the piezoelectric element 32 in a direction orthogonal to the nozzle row direction and a metal layer 44 laminated on the upper electrode layer 39. Out of the layers constituting the individual terminal 41 at least the metal layer 44 extends over the piezoelectric layer 38. A bump electrode 40, to be described below, is coupled to metal layer 44 laminated on the piezoelectric layer 38. It should be noted that the metal layer 44 is also laminated on an end portion of the piezoelectric element 32 in the lengthwise direction (that is, the direction orthogonal to the nozzle row direction). That is, the metal layer 44 is laminated across the boundary between the driving region 35 and the non-driving region 36. In this way, excessive deformation in the end portion of the piezoelectric element 32 can be suppressed and damage to the piezoelectric layer 38 in the boundary between the driving region 35 and the non-driving region 36 can be suppressed.

In the present embodiment, the upper electrode layer 39 extending from the row of the piezoelectric element 32 on one side and the upper electrode layer 39 from the row of the piezoelectric element 32 on the other side are coupled to each other (not shown) by non-driving region 36 between the rows of the piezoelectric element 32. That is, in the non-driving region 36 between the rows of the piezoelectric element 32, the upper electrode layer 39 common to both sides of the piezoelectric element 32 is formed. As shown in FIG. 2, the metal layer 44 to be the common terminal 42 is laminated on the upper electrode layer 39. Then, to this metal layer 44 is coupled a corresponding bump electrode 40.

As the lower electrode layer 37 and the upper electrode layer 39b described above, various metals such as iridium (Ir), platinum (Pt), titanium (Ti), tungsten (W), nickel (Ni), palladium (Pd), gold (Au), or the like, alloys thereof, alloys such as $LaNiO_3$, and the like are used. As the piezoelectric layer 38, a ferroelectric piezoelectric material such as lead zirconate titanate (PZT) or a relaxor ferroelectric substance in which metals such as niobium (Nb), nickel (Ni), magnesium (Mg), bismuth (Bi) or yttrium (Y) are added to the ferroelectric piezoelectric material is used. Besides, a non-lead material such as barium titanate can also be used. Further, as the metal layer 44, an adhesion layer, made of titanium (Ti), nickel (Ni), chromium (Cr), tungsten (W), alloys thereof, or the like, on which gold (Au), copper (Cu) or the like is laminated is used.

As shown in FIG. 2, the sealing plate 33 (corresponding to the second substrate in the present invention) is a plate-shaped silicon substrate disposed at an interval from the pressure chamber formation substrate 29 (specifically from the piezoelectric element 32 laminated on the pressure chamber formation substrate 29) in a state where an adhesion layer 43 is interposed between the sealing plate 33 and the piezoelectric element 32. The piezoelectric element 32 is protected by the sealing plate 33. In the present embodiment, the sealing plate 33 is made of a silicon single crystal substrate having the crystal surface orientation of the surface (upper surface and lower surface) as (110) surface. In the present embodiment, a plurality of bump electrodes 40 that output a drive signal from the drive IC 34 to the piezoelectric element 32 side are formed on the lower surface (surface on the pressure chamber formation substrate 29 side) of the sealing plate 33. As shown in FIG. 2, a plurality of the bump electrodes 40 are formed at a position where the bump electrode 40 faces one individual terminal 41 formed outside one piezoelectric element 32, at a position where the bump electrode 40 faces the other individual terminal 41 formed outside the other piezoelectric element 32, and at a position where the bump electrode 40 faces the common terminal 42 formed between the rows of both piezoelectric elements 32, respectively in the nozzle row direction. Then, each bump electrode 40 is coupled with the metal layer 44 (that is, individual terminal 41 or common terminal 42) respectively.

In the present embodiment, the bump electrode 40 has elasticity and protrudes from the surface of the sealing plate 33 toward the diaphragm 31 side. Specifically, as shown in FIG. 3, the bump electrode 40 includes a resin portion 40a having elasticity and a conductive film 40b covering the surface of at least a part of the resin portion 40a. As shown in FIG. 4, the resin portion 40a is formed as a ridge in the nozzle row direction (in other words, juxtaposition direction of the piezoelectric elements 32) on the surface of the sealing plate 33. The conductive film 40b conducted to the individual terminal 41 is disposed side by side in the nozzle row direction, corresponding to the piezoelectric element 32. As shown in FIG. 3, each of the conductive films 40b extends in a direction orthogonal to the nozzle row direction and becomes a lower surface side wiring 47 formed on the lower surface of the sealing plate 33. In other words, each of the conductive films 40b is coupled with the lower surface side wiring 47. An end portion on the side of the lower surface side wiring 47, opposite to the bump electrode 40, is coupled with the through wiring 45. The through wiring 45 is wiring relaying between the lower surface and the upper surface of the sealing plate 33, and a conductor such as a metal is formed inside the through hole penetrating the sealing plate 33 in the plate thickness direction. The end portion on the upper surface side of the through wiring 45 is coupled with the corresponding upper surface side wiring 46. The upper surface side wiring 46 extends from the through wiring 45 to a position at which the upper surface side wiring 46 faces the IC terminal 51 of the drive IC 34 and is coupled with the IC terminal 51 at the position. The conductive film 40b conducted to the common terminal 42 extends to the outside of the resin portion 40a in the nozzle row direction and is coupled with the through wiring 45 (not shown). Then, through the through wiring 45, the conductive film 40b is coupled with the upper surface side wiring 46 and then is coupled with the wiring substrates such as flexible printed substrate (FPC) or the like. It should be noted that the bump electrode is not limited to the one having a resin portion. A bump electrode that is made of a metal alone and has no resin portion inside and a bump electrode made by solder can be adopted.

As shown in FIG. 4, the adhesion layer 43 that joins (adheres) the pressure chamber formation substrate 29, on which the diaphragm 31 and the piezoelectric element 32 are laminated, to the sealing plate 33 is provided at the outer peripheral portion of the sealing plate 33 and both end portions of the piezoelectric element 32 in the lengthwise direction. As shown in FIG. 3, the outer side (opposite side to the piezoelectric element 32 side) end of the outer peripheral adhesion layer 43a provided at the outer peripheral portion of the sealing plate 33 is provided inside (piezoelectric element 32 side) the outer side end of the sealing plate 33 and the outer side end of the diaphragm 31. Then, the piezoelectric element 32 is disposed in a space 48 surrounded by the outer peripheral adhesion layer 43a, the pressure chamber formation substrate 29 and the sealing plate 33. That is, that piezoelectric element 32 is formed between the pressure chamber formation substrate 29 and the sealing plate 33 inside the space 48 surrounded by the outer peripheral adhesion layer 43a. An opening hole (not shown) of a small diameter is opened in the sealing plate 33. The space 48 is opened to the atmosphere through the opening hole. In-space adhesion layer 43b provided at both end portions of the piezoelectric element 32 extends in the extension direction of the resin portion 40a of the bump electrode 40. It should be noted that the in-space adhesion layer 43b is not limited to the disposition presented in the present embodiment, but may be disposed at any position in accordance with the disposition of the wiring and the piezoelectric element 32.

Here, in the present embodiment, as the adhesion layer 43, one having photosensitivity and thermosetting property is used. In the present embodiment, the adhesion layer 43 is made of the same type of piezoelectric element of a resin as the protection layer 50 and has mechanical properties (that is, rupture stress, rupture elongation, Young's modulus) as described above after curing. For example, as the protection layer 50 and the adhesion layer 43, a resin containing an epoxy resin, an acrylic resin, a phenol resin, a polyimide resin, a silicon resin, a styrene resin, or the like is preferably used. The adhesion layer 43 is thicker than the protection layer 50 and is formed to have a thickness of tens of micrometers. The pressure chamber formation substrate 29 on which the diaphragm 31 or the like is laminated and the sealing plate 33 are held by the adhesion layer 43 at an interval of tens of micrometers.

The drive IC 34 is an IC chip for driving the piezoelectric element 32 and is laminated on the upper surface of the sealing plate 33 through an adhesive 54 such as an anisotropic conductive film (ACF). As shown in FIGS. 2 and 3, a plurality of IC terminals 51 coupled to the terminal portion of the upper surface side wiring 46 are formed on the lower surface (surface on the sealing plate 33 side) of the drive IC 34. Corresponding to the individual terminals 41, the IC terminals 51 are disposed side by side in the nozzle row direction. In the present embodiment, corresponding to the rows of the piezoelectric element 32 disposed side by side in two rows, the IC terminals 51 are formed in two rows.

Then, the recording head 3 formed as described above introduced the ink from the ink cartridge 7 into the pressure chamber 30 through the liquid introduction path 18, common liquid chamber 25, the individual communication path 26, and the like. In this case, if the drive signal from the drive IC 34 is supplied to the piezoelectric element 32 through the bump electrode 40 or the like, the piezoelectric element 32 is driven and a pressure variation occurs in the ink in the pressure chamber 30. Using this pressure variation, the recording head 3 ejects ink droplets from the nozzle 22.

Figure 5:
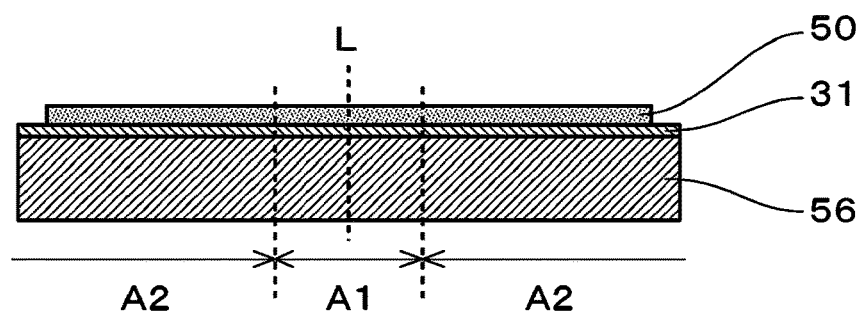
FIG. 5 is an enlarged sectional view of a cutting region, describing a manufacturing method of the actuator unit.
Figure 6:
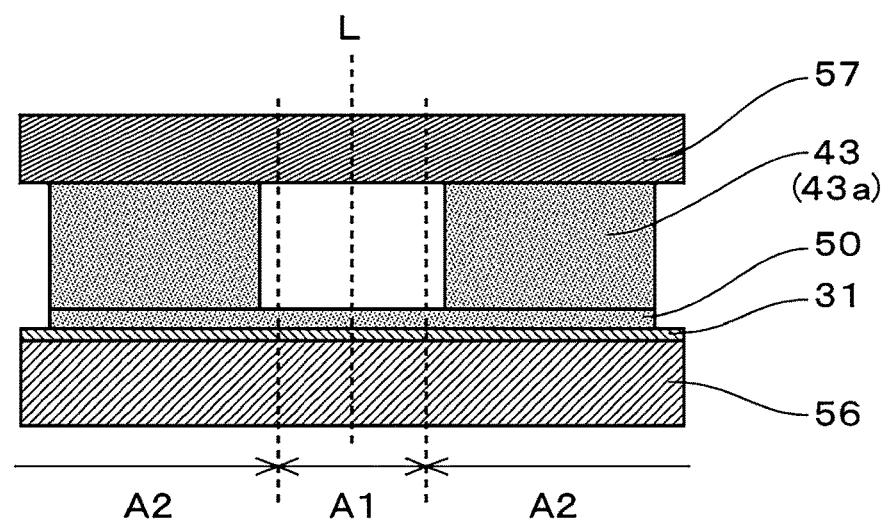
FIG. 6 is an enlarged sectional view of the cutting region, describing the manufacturing method of the actuator unit.
Figure 7:
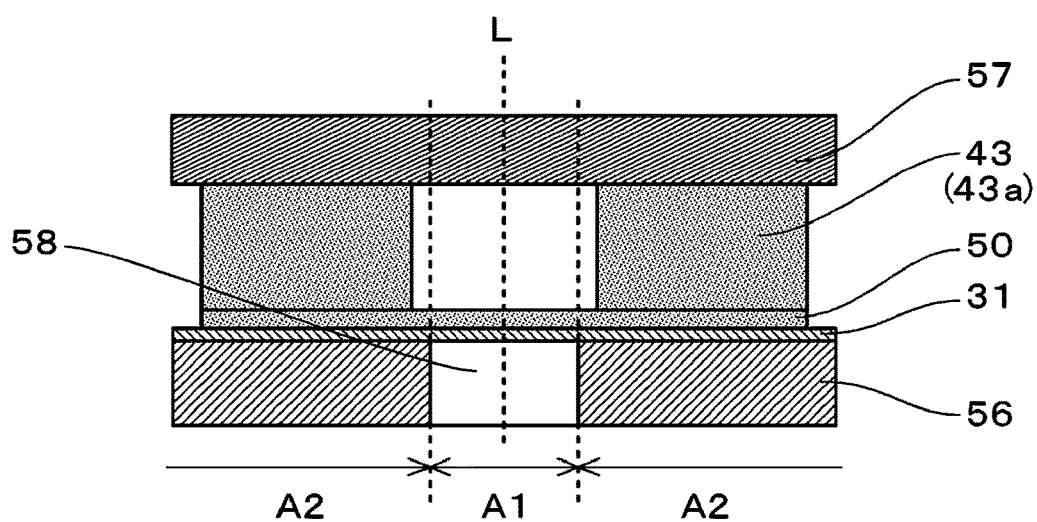
FIG. 7 is an enlarged sectional view of the cutting region, describing the manufacturing method of the actuator unit.
Figure 8:
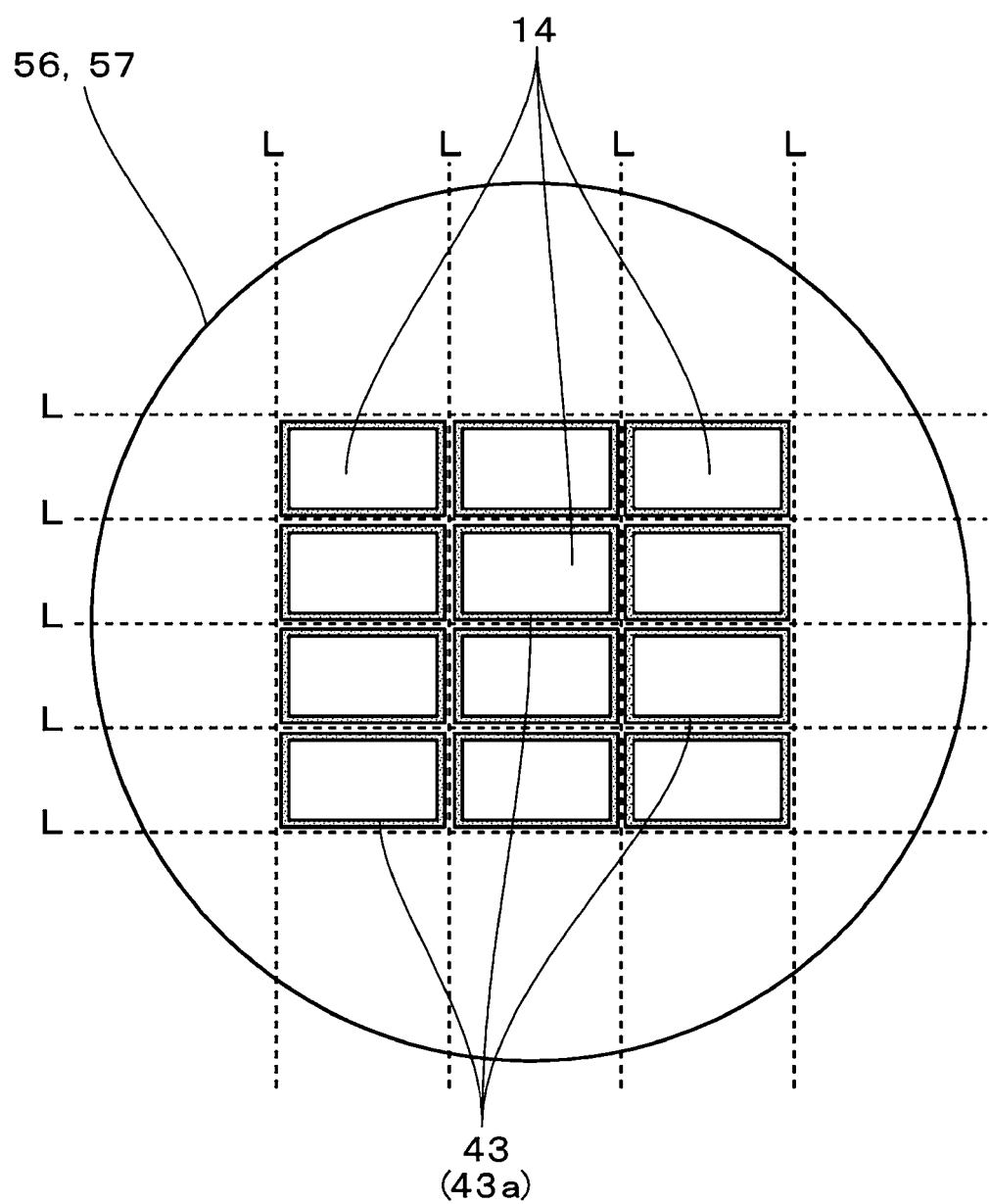
FIG. 8 is a plan view schematically showing the joined first mother substrate and second mother substrate.

Next, a manufacturing method of the recording head 3, a manufacturing method of the actuator unit 14 in particular, will be described in detail. In the present embodiment, the actuator unit 14 is obtained by joining the first mother substrate 56 (for example, a silicon wafer) to be a plurality of pressure chamber formation substrates 29 to the second mother substrate 57 (for example, a silicon wafer) to be a plurality of the sealing plates 33 with the adhesion layer 43 interposed therebetween and diving into individual pieces along the cutting line. FIGS. 5 to 7 are sectional views of the cutting region A1 (region between the regions A2 to be adjacent pressure chamber formation substrate 29) describing the manufacturing method of the actuator unit 14. FIG. 8 is a plan view schematically showing a state in which the first mother substrate 56 is joined to the second mother substrate 57. In each figure, a broken line represents the cutting line L (also referred to as a cutting schedule line). In FIG. 8, the in-space adhesion layer 43b is omitted.

First, a plurality of pressure chamber formation substrates 29 (that is, regions to be the pressure chamber formation substrates 29 after cutting) are formed on the first mother substrate 56 and a plurality of the sealing plates 33 (that is, regions to be the sealing plates 33 after cutting) are formed on the second mother substrate 57. Specifically, in the first mother substrate 56, first, the diaphragm 31, the lower electrode layer 37, the piezoelectric layer 38, the upper electrode layer 39, the metal layer 44, and the like are laminated on the surface. It should be noted that these layers are formed through a semiconductor process (that is, a film forming step, a photolithography step, an etching step, and the like). On the other hand, in the second mother substrate 57, first, a through hole or the like to be the through wiring 45 is formed by a processing method such as a laser or dry etching, and then, conductive material is embedded inside the through hole by the electroplating method or the like to form the through wiring 45. Through the semiconductor process, the bump electrode 40, the lower surface side wiring 47, and the like are formed on the lower surface (that is, surface on the side facing the first mother substrate 56) of the second mother substrate 57, and the upper surface side wiring 46 and the like are formed on the upper surface (that is, surface on the opposite side to the surface facing the first mother substrate 56) of the second mother substrate 57.

If the diaphragm 31 and the like are formed on the first mother substrate 56, the protection layer 50 is formed in the cutting region A1 on the upper surface (that is, surface on which the diaphragm 31 and the like are laminated) of the first mother substrate 56 in the protection layer formation step. The cutting region A1 is a region between the regions A2 to be the adjacent pressure chamber formation substrates 29 and is set to a region including the cutting line L set in advance. Even after cutting, a part of the diaphragm 31 and the like in the cutting region A1 remains protruding outside the outer shape of the pressure chamber formation substrate 29. In the present embodiment, as shown in FIG. 5, the protection layer 50 is formed from the region, where the outer peripheral adhesion layer 43a is to be formed, of the region A2 to be the pressure chamber formation substrate 29 over the region, where the outer peripheral adhesion layer 43a is to be formed, of the region A2 to be the adjacent pressure chamber formation substrate 29 with the cutting region A1 interposed therebetween. For example, the first mother substrate 56 is coated with a liquid photosensitive resin having photosensitivity and thermosetting property on the surface by a spin coater or the like and then, after temporary curing by heating, is exposed to light and developed to form a protection layer 50 at a predetermined position.

Next, in the substrate joining step, the first mother substrate 56 is joined to the second mother substrate 57 with the adhesion layer 43 interposed therebetween. Specifically, the adhesion layer 43 is formed at the outer peripheral portion of the region A2, to be the pressure chamber formation substrate 29, off from the cutting region A1 on either of the upper surface of the first mother substrate 56 or the lower surface of the second mother substrate 57, and both end portions of the region in which the piezoelectric element 32 is formed. For example, the first mother substrate 56 or the second mother substrate 57 is coated with the liquid photosensitive resin having photosensitivity and thermosetting property on the surface by a spin coater or the like and then, after a temporary curing by heating, is exposed to light and developed to form an adhesion layer 43 at a predetermined position. After that, either of the first mother substrate 56 or the second mother substrate 57 is, or both are, moved in a direction in which the two approach each other. Then, the first mother substrate 56 and the second mother substrate 57 are pressed and heated from both sides, with the adhesion layer 43 and the protection layer 50 interposed therebetween. In this way, as shown in FIG. 6, the adhesion layer 43 and the protection layer 50 are fully cured, and the first mother substrate 56 is joined to the second mother substrate 57 through the adhesion layer 43 and the protection layer 50. That is, as shown in FIG. 8, a composite substrate composed of the first mother substrate 56 and the second mother substrate 57, inside which a plurality of regions to be the actuator units 14 are formed, is manufactured. Here, as shown in FIG. 8, the adhesion layer 43 is not formed on the cutting line L, in other words, the adhesion layer 43 is removed. Specifically, as shown in FIG. 6, the interval between the first mother substrate 56 and the second mother substrate 57 in the cutting region A1 becomes a space in which the adhesion layer 43 is removed.

If the first mother substrate 56 is joined to the second mother substrate 57, the process proceeds to the etching step. It should be noted that, prior to the etching step, a step may be performed in which the lower surface of the first mother substrate 56 (surface on the opposite side to the second mother substrate 57) is shaved by a grinding method such as chemical mechanical polishing (CMP) to thin the first mother substrate 56. In the etching step, the first mother substrate 56 of the region (not shown) that corresponds to the cutting region A1 and the pressure chamber 30 is removed by etching from the lower side surface in the thickness direction. For example, a resist layer exposed and developed to be patterned is formed on the lower surface side of the first mother substrate 56 and, after etching (for example, wet etching) is performed with this resist layer as a mask, the resist layer is peeled off. At this time, a protection film is pasted on the upper surface of the second mother substrate 57 so that the etching solution, the peeling solution, and the like do not seep between the first mother substrate 56 and the second mother substrate 57. In this way, as shown in FIG. 7, in the cutting region A1 of the first mother substrate 56, the first mother substrate 56 is removed and the diaphragm 31 and the protection layer 50 are left behind to form a groove 58. A space (not shown) to serve as the pressure chamber 30 is also formed simultaneously with the formation of the groove 58. As a result, in the cutting region A1, only the second mother substrate 57, the protection layer 50, and the diaphragm 31 remain. The inner wall surface (side surface) in the groove 58 is the surface that becomes the outer peripheral wall (outer shape) of the pressure chamber formation substrate 29 after cutting. That is, in the groove 58, the outer peripheral walls of the adjacent pressure chamber formation substrate 29 face each other.

If the groove 58 is formed in the cutting region A1 of the first mother substrate 56, in the division step, the joined first mother substrate 56 and the second mother substrate 57 is cut in the cutting region A1 and divided into individual actuator units 14 (that is, the pressure chamber formation substrate 29 and the sealing plate 33). Specifically, a fragile portion is formed along the cutting line L of the second mother substrate 57 by a laser, a cutter, or the like, and is divided by the expanded break. The expanded break is a method of pasting a sheet member having stretchability on either of the first mother substrate 56 or the second mother substrate 57 and, by radially pulling the sheet member from the center, dividing the first mother substrate 56 and the second mother substrate 57. In the present embodiment, since the first mother substrate 56 in the cutting region A1 is removed and the adhesion layer 43 is not provided in the cutting region A1, the second mother substrate 57, the protection layer 50, and the diaphragm 31 are practically cut. Then, a part of, or the entire, second mother substrate 57, the protection layer 50, and the diaphragm 31 formed in the cutting region A1 remains even after cutting. That is, as shown in FIG. 3, the sealing plate 33, the protection layer 50 and the diaphragm 31 protrude outside the outer shape of the piezoelectric element of the pressure chamber formation substrate 29. The method of dividing the first mother substrate 56 and the second mother substrate 57 is not limited to the expanded break but can include cutting by dicing or the like.

Thereafter, the drive IC 34, the communication substrate 24, the nozzle plate 21, and the head case 16 are attached to the individual actuator units 14. Specifically, the drive IC 34 is joined to the upper surface of the sealing plate 33 through the adhesive 54. The communication substrate 24 is joined to the lower surface of the pressure chamber formation substrate 29 and the nozzle plate 21 is joined to the lower surface of the communication substrate 24. Then, the head case 16 is attached to the upper surface of the communication substrate 24 in a state where the actuator unit 14 accommodated inside the accommodation space 17. In this way, it is possible to manufacture the recording head 3 in which the protection layer 50 and the diaphragm 31 as described extend to the outside of the end the pressure chamber formation substrate 29.

By preparing the recording head 3 as described above, it is possible to manufacture the highly reliable recording head 3. That is, since the adhesion layer 43 is formed in the region off from the cutting region A1, in other words, since a space is formed between the first mother substrate 56 (specifically, the protection layer 50) and the second mother substrate 57 in the cutting region A1, the first mother substrate 56 and the second mother substrate 57 are easily cut. Since the first mother substrate 56 in the cutting region A1 is removed, the first mother substrate 56 and the second mother substrate 57 are more easily cut. In this way, cutting failure of the first mother substrate 56 and the second mother substrate 57 is suppressed. That is, for example, when an adhesion layer is formed in the cutting region or when the first mother substrate is not removed, there is a concern that a problem of being unable to cut in the cutting region occurs, but it is possible to suppress such a problem. Since the adhesion layer 43 (outer peripheral adhesion layer 43a) and the first mother substrate 56 (pressure chamber formation substrate 29) are off from the cutting line L, it is possible to suppress the generation of burrs on the outer side end surfaces of the outer peripheral adhesion layer 43a and the pressure chamber formation substrate 29 and the generation of foreign substance due to chipping of a part thereof at the time of cutting. Further, since the protection layer 50 made of a resin is formed in the cutting region A1, it is possible to suppress the generation of foreign substance due to chipping of a part of the diaphragm 31 at the time of cutting. In addition, since the protection layer 50 is laminated on the diaphragm 31, it is possible to suppress the generation of a crack in the diaphragm 31 in the cutting region A1 in a state before cutting. Then, even if a crack is generated in the diaphragm 31 in the cutting region A1, since the protection layer 50 is present, in the etching step, it is possible to suppress seepage of the etching solution, the peeling solution, and the like between the first mother substrate 56 and the second mother substrate 57. As a result, it is possible to suppress damage to the adhesion layer 43 from the etching solution, peeling solution, and the like and it is possible to suppress the decrease of the adhesion strength.

In the present embodiment, since the actuator unit 14 extends from the region where the protection layer 50 overlaps with the adhesion layer 43 (outer peripheral adhesion layer 43a) to the diaphragm 31 outside the end of the pressure chamber formation substrate 29, compared with the case where the protection layer 50 is not formed outside the pressure chamber formation substrate, it is possible to expand the adhesion area (adhesion area with the protection layer 50) on the pressure chamber formation substrate 29 side. As a result, it is possible to increase the adhesion strength between the protection layer 50 and the diaphragm 31, and consequently, it is possible to increase the joining strength between the pressure chamber formation substrate 29 and the sealing plate 33. In the present embodiment, since the protection layer 50 and the adhesion layer 43 are made of the same type of piezoelectric element of a resin, it is possible to raise the adhesion between the protection layer 50 and the adhesion layer 43. As a result, it is possible to further increase the joining strength between the pressure chamber formation substrate 29 and the sealing plate 33. Further, in the present embodiment, since the photosensitive resin is used as the protection layer 50 and the adhesion layer 43, pattern formation of the protection layer 50 and the adhesion layer 43 is facilitated. As a result, manufacturing the actuator unit 14 is facilitated.

By the way, in the embodiment described above, the protection layer 50 and the adhesion layer 43 have the photosensitivity and not limited thereto. It is possible to adopt a configuration in which the protection layer and the adhesion layer are made of a resin that does not have the photosensitivity. In this case, the protection layer and the adhesion layer are formed at predetermined positions by using a dispenser or a liquid ejecting head. The protection layer and the adhesion layer are not limited to the same kind of resin but can be configured with different kinds of resins. In this case, the protection layer functions as an intermediate layer between the adhesion layer and the pressure chamber formation substrate (diaphragm laminated on the pressure chamber formation substrate), for example, even when the adhesion force between the adhesion layer and the diaphragm is weak, the adhesion layer can be adhered to the pressure chamber formation substrate through the protection layer. That is, even when the adhesion force between the diaphragm and the adhesion layer is not sufficiently obtained, joining strength between the pressure chamber formation substrate and the sealing plate can be secured. As a result, the choice materials that can be used as the adhesion layer increases and the degree of freedom of design increases. Further, the protection layer is not limited to a resin, but can be made of metal or the like. However, from the viewpoint of the reinforcing the diaphragm, it is preferable that the rupture stress, rupture elongation, or Young's modulus be large. That is, a resin is preferable. In this way, for example, even if a crack is generated in the diaphragm due to an impact from the outside, the generation of a crack in the protection layer can be suppressed. As a result, in the etching step, it is possible to suppress the seepage of the etching solution between the first mother substrate and the second mother substrate by the protection layer.

In the embodiment described above, the protection layer 50 extends from a portion (that is, the cutting region A1) outside the end of the pressure chamber formation substrate 29 to a position where the protection layer 50 overlaps with the adhesion layer 43 (outer peripheral adhesion layer 43*a*), but is not limited thereto. The protection layer can be formed in the space surrounded by the outer peripheral adhesion layer as long as it is off from the region (that is, individual terminal and common terminal) where the bump electrode is coupled to and the region (that is, driving region) where the pressure chamber is faced. Further, the protection layer can be formed only at a portion outside the end of the pressure chamber formation substrate without overlapping with the outer peripheral adhesion layer. In other words, the protection layer can be laminated at least on a portion (that is, cutting region) outside the end of the pressure chamber formation substrate. In the embodiment described above, the protection layer 50 is provided away from the sealing plate 33, but is not limited thereto. For example, it is possible to adopt a configuration in which the entire or a part of the protection layer 50 is in close contact with the sealing plate 33. Further, in the embodiment described above, the protection layer and the adhesion layer are formed in different steps (protection layer formation step and substrate joining step) but are not limited thereto. For example, in the protection layer formation step, using an electron beam exposure apparatus or the like, it is possible to form the protection layer and the adhesion layer simultaneously by differentiating the exposure amount of the photosensitive resin. In the substrate joining step, the entire adhesion layer 43 of the cutting region A1 is removed but is not limited thereto. A part of the adhesion layer can remain in the cutting region.

FIG. 8 shows an example in which actuator units 14 are disposed side by side in four rows in the vertical direction and in three columns in the horizontal direction on the joined first mother substrate 56 and second mother substrate 57, but are not limited thereto. The number of actuator units disposed side by side on the first mother substrate and the second mother substrate can be appropriately designed in accordance with the size of the actuator unit. The description described above presents an example in which ink, which is a kind of liquid, is ejected from the nozzle 22 when the piezoelectric element 32, which is a kind of drive element provided on the pressure chamber formation substrate 29, is displaced, but this is not a limit. The present invention is applicable to any MEMS device in which the first substrate and the second substrate are joined by an adhesion layer. For example, the present invention is also applicable to a sensor for detecting a pressure change, a vibration, displacement, or the like.

Hitherto, the ink jet type recording head 3 is described as an example of the liquid ejecting head, but the present invention can also be applied to another liquid ejecting head and a liquid ejecting apparatus that includes the liquid ejecting head. For example, the present invention can also be applied to a color material ejecting head used in the manufacturing of a color filter such as a liquid crystal display or the like, an electrode material ejecting head used in the electrode formation such as an organic electro luminescence (EL) display, a field emission display (FED), or the like, a biological organic material ejecting head used in the manufacturing of a biochip (biochemistry element), or the like. In the color material ejecting head for display manufacturing apparatus, a solution of each color material of red (R), green (G), and blue (B) is ejected as a kind of liquid. In the electrode material ejecting head for an electrode formation apparatus, a liquid electrode material is ejected as a kind of a liquid, and in the biological organic material ejecting head for a chip manufacturing apparatus, a bioorganic matter is ejected as a kind of a liquid.

REFERENCE SIGNS LIST

1 printer
2 recording medium
3 recording head
4 carriage
5 carriage moving mechanism
6 transport mechanism
7 ink cartridge
8 timing belt
9 pulse motor
10 guide rod
14 actuator unit
15 flow path unit
16 head case
17 accommodation space
18 liquid introduction path
21 nozzle plate
22 nozzle
24 communication substrate
25 common liquid chamber
26 individual communication path 27 nozzle communication path
29 pressure chamber formation substrate
30 pressure chamber
31 diaphragm
32 piezoelectric element
33 sealing plate
34 drive IC
35 driving region
36 non-driving region
37 lower electrode layer
38 piezoelectric layer
39 upper electrode layer
40 bump electrode
40a resin portion
40b conductive film
41 individual terminal
42 common terminal
43 adhesion layer
43a outer peripheral adhesion layer
43b in-space adhesion layer
44 metal layer
45 through wiring
46 upper surface side wiring
47 lower surface side wiring
48 space
50 protection layer
51 IC terminal
54 adhesive
56 the first mother substrate
57 the second mother substrate
58 groove

The invention claimed is:

1. An MEMS device comprising:
a first substrate on which a flexibly deformable thin film member is laminated;
a second substrate disposed at an interval with respect to the first substrate; and
an adhesion layer that adheres the first substrate to the second substrate,
wherein an end of the thin film member extends to an outside of an end of the first substrate in an in-plane direction of the first substrate.

2. The MEMS device according to claim 1,
wherein a protection layer is laminated at least on a portion of the thin film member outside the end of the first substrate.

3. The MEMS device according to claim 2,
wherein the protection layer and the second substrate are provided apart from each other, and
a space is formed between the protection layer and the second substrate.

4. The MEMS device according to claim 2,
wherein the protection layer is made of a resin.

5. The MEMS device according to claim 2,
wherein a part of the protection layer overlaps with the adhesion layer.

6. The MEMS device according to claim 2,
wherein the protection layer and the adhesion layer are made of the same kind of resin.

7. A liquid ejecting head that has a structure of the MEMS device according to claim 1.

8. A liquid ejecting apparatus comprising:
the liquid ejecting head according to claim 7.

* * * * *